(12) United States Patent
Karp et al.

(10) Patent No.: US 9,164,390 B2
(45) Date of Patent: Oct. 20, 2015

(54) METHOD OF PREPARING FLEXOGRAPHIC PRINTING MEMBERS

(71) Applicants: Michael Karp, Petah Tikva (IL); Avigdor Bieber, Ra'ananna (IL)

(72) Inventors: Michael Karp, Petah Tikva (IL); Avigdor Bieber, Ra'ananna (IL)

(73) Assignee: VIM Technologies, Inc., Kibbutz Hanita (IL)

( * ) Notice: Subject to any disclaimer, the term of this patent is extended or adjusted under 35 U.S.C. 154(b) by 3 days.

(21) Appl. No.: 14/073,433

(22) Filed: Nov. 6, 2013

(65) Prior Publication Data

US 2015/0125796 A1    May 7, 2015

(51) Int. Cl.
*G03F 7/00* (2006.01)
*G03F 7/20* (2006.01)

(52) U.S. Cl.
CPC .............. *G03F 7/2022* (2013.01); *G03F 7/20* (2013.01)

(58) Field of Classification Search
CPC ................................ B41C 1/003; G03F 7/202
USPC ......................................................... 430/306
See application file for complete search history.

(56) References Cited

U.S. PATENT DOCUMENTS

| 3,264,103 | A | 8/1966 | Cohen et al. |
| 4,680,251 | A | 7/1987 | Schober |
| 4,725,528 | A | 2/1988 | Koch et al. |
| 4,927,723 | A | 5/1990 | Cusdin |
| 5,015,556 | A | 5/1991 | Martens |
| 5,175,072 | A | 12/1992 | Martens |
| 5,215,859 | A | 6/1993 | Martens |
| 5,260,166 | A | 11/1993 | Nazzaro et al. |
| 5,279,697 | A | 1/1994 | Peterson et al. |
| 6,383,692 | B1 * | 5/2002 | Leenders et al. ................... 430/5 |
| 6,558,876 | B1 | 5/2003 | Fan |
| 7,032,512 | B2 * | 4/2006 | Salvestro ................... 101/401.1 |
| 7,384,685 | B2 | 6/2008 | Kuczynski et al. |
| 8,252,514 | B2 | 8/2012 | McLean et al. |
| 8,389,203 | B2 | 3/2013 | Sievers |
| 2011/0275017 | A1 * | 11/2011 | Tuckwiller et al. ........... 430/306 |

* cited by examiner

*Primary Examiner* — Chanceity Robinson
(74) *Attorney, Agent, or Firm* — Morgan, Lewis & Bockius LLP

(57) ABSTRACT

Following imagewise exposure of a sandwiched photopolymer layer, the outer layers between which the photopolymer is interposed are separated in a manner that leaves some photopolymer on each of the separated layers. The photopolymer remaining on one layer contains the raised pattern that will carry ink, and may be subjected to further exposure to actinic radiation in order to complete the curing process without the need for washing; the photopolymer remaining on the other layer can be removed and reused. As a result, waste is minimized or eliminated.

20 Claims, 7 Drawing Sheets

METHOD OF PREPARING FLEXOGRAPHIC PRINTING MEMBERS

BACKGROUND OF THE INVENTION

Flexography utilizes resilient relief members to transfer an image from a printing member to a recording medium. As in letterpress printing, a flexographic member or plate has a surface comprising an "imagewise" pattern of raised features. Ink is applied to and carried by these raised features and transferred therefrom to the image receiver. Although developed primarily for printing packaging materials, flexography is today used in a wide variety of applications and on recording media such as paper, corrugated board, films, foils, and laminates.

Flexographic printing plates can be prepared from photosensitive elements comprising a photopolymerizable layer containing an elastomeric binder, a monomer, and a photoinitiator, interposed between a support and a cover sheet or multilayer cover element. A standard process of making such photosensitive elements is described in U.S. Pat. No. 4,460,675; as set forth therein, a previously extruded photopolymerizable composition is fed into the nip of a calender (i.e., a series of hard, high-pressure rollers in rolling contact) and is pressed between a support and a multilayer cover element to form a photopolymerizable layer. Upon imagewise exposure of the photosensitive element to actinic radiation through a photomask, the exposed areas of the photopolymerizable layer become insolubilized. Treatment with a suitable solvent or solvent mixture removes the unexposed areas of the photopolymerizable layer, leaving a printing relief which can be used for flexographic printing. See also U.S. Pat. Nos. 4,323,637, 4,427,759, and 4,894,315.

A common technique for bringing a photosensitive element and a photomask into close contact with one another is to draw a vacuum between them, usually by means of a vacuum frame. Digital methods and associated recording materials that do not require a separate photomask have also been developed; see, e.g., PCT Appl. Nos. WO 94/03838, WO 94/03839, and WO 96/16356. Such recording materials comprise a conventional photopolymerizable layer, as described above, and additionally a layer capable of forming an integrated photomask. The additional layer is sensitive to infrared (IR) radiation but opaque to actinic (e.g., ultraviolet (UV)) radiation. This IR-sensitive layer may be imaged digitally, whereby the IR-sensitive material is imagewise vaporized or transferred to a superposed film. Subsequent overall exposure of the photopolymerizable element to actinic radiation through the integrated photomask produces an imagewise pattern of hardened regions; unpolymerized areas that did not receive exposure, and remaining areas of the IR-sensitive layer, are washed away. Following drying, the flexographic printing plate is ready for use.

Developing the exposed photosensitive element with a solvent or solvent mixture is time-consuming, since drying for extended period (0.5 to 24 hours) is typically necessary to remove entrained developer solution. In addition, these developing systems produce potentially toxic by-product wastes (both the solvent and any material carried off by the solvent) during the development process. For printing of food packaging, elimination of solvent residue on the finished plate is also crucial.

To avoid these problems, a "dry" thermal development process may be used. In this approach the photosensitive layer, which has been imagewise exposed to actinic radiation, is brought into contact with an absorbent material at a temperature sufficient to cause the unexposed portions of the photosensitive layer to soften or melt and flow into the absorbent material. See, e.g., U.S. Pat. Nos. 3,264,103, 5,015,556, 5,175,072, 5,215,859 and 5,279,697. A photosensitive silver-halide film target in a vacuum frame is imagewise exposed, and the exposed portions thereof layer remain hard at the softening temperature for the unexposed portions. The absorbent material collects the unexposed and softened material, and is then separated and/or removed from the photosensitive layer. The cycle of heating and contacting the photosensitive layer may need to be repeated several times in order to sufficiently remove the flowable composition from the unirradiated areas and form a relief structure suitable for printing. The resulting raised relief structure of irradiated, hardened photopolymer represents the desired printing image.

Finally, the flexographic printing plate prepared by any of the above-described processes (that is, having the imagewise relief pattern) may be post-exposed and/or chemically or physically after-treated in any sequence to detackify the surface. For example, UV radiation with a wavelength not longer than 300 nm may be used for post-exposure for detackification.

Another type of flexographic plate is produced from a liquid photopolymer. In a typical production process, a clear plastic protective cover film is mounted over a transparency having a negative version of the image to be printed. The transparency is placed emulsion-side up on an exposure unit that emits actinic radiation. A motorized carriage then deposits a layer of liquid photopolymer over the transparency and cover film. The carriage ensures that the liquid is deposited evenly over the cover film and at a controlled thickness. As the liquid is deposited, the carriage also places a substrate sheet over the liquid. The substrate sheet is specially coated on one side to bond with the liquid photopolymer and to serve as the back of the plate after exposure. Initially, the entire substrate side of plate is exposed to actinic radiation. This exposure hardens a thin base layer of the liquid photopolymer and causes it to adhere to the plate substrate. A second exposure through the negative forms the image on the plate. As with sheet materials, the image areas are hardened by this exposure while the non-image areas remain liquid. The hardened photopolymer, adhered to the substrate, is removed and subjected to chemical processing (i.e., washing with solvent or water-based fluids) to remove unwanted liquid in the non-image areas, leaving raised image areas. A post-exposure cure hardens the whole plate. In some systems, uncured photopolymer is reclaimed for reuse.

While this type of flexographic plate is conveniently prepared, ecologically deleterious waste is ordinarily produced during processing. In addition, the image quality may be inferior to that of digitally produced flexographic plates due to the cover film between the image and the photopolymer; the thickness of the film produces higher dot gain and lower tonal resolution. Accordingly, there is a need for techniques for producing liquid-photopolymer flexographic plates with reduced production of waste and without an intermediate cover film.

SUMMARY OF THE INVENTION

In accordance with embodiments of the present invention, following imagewise exposure of a photopolymer layer, the outer layers between which the photopolymer is interposed—e.g., the substrate and the photomask—are separated in a manner that leaves some photopolymer on each of the separated layers. The photopolymer remaining on the substrate contains the raised pattern that will carry ink, and is typically subjected to further exposure to actinic radiation in order to complete the curing process; the photopolymer remaining on the photomask, on the other hand, can be removed and reused. As a result, it is unnecessary to subject the imaged plate to a washing step that creates chemical waste, and reuse of unexposed photopolymer minimizes or eliminates material waste. The present approach, therefore, offers substantial ecological benefits compared to traditional processing techniques. Moreover, a separate cover film between the photomask and the photopolymer layer is unnecessary, so image quality is improved.

In some embodiments the photopolymer is applied as a liquid during plate manufacture, while in other embodiments the photopolymer is a solid or semisolid; in the latter case the plate may be sold in ready-to-image form rather than being, in effect, assembled during the imaging process.

Accordingly, in a first aspect, embodiments of the invention pertain to a method of creating imaging a flexographic printing member. Embodiments of the method involve the steps of providing a precursor comprising (i) an imaged photomask having an imagewise pattern of opaque and non-opaque regions, the opaque regions substantially blocking passage therethrough of actinic radiation, (ii) a support, and (iii) disposed between the photomask and the support and in contact with opposed surfaces thereof, a layer of photopolymer polymerizable by actinic radiation; exposing the precursor to actinic radiation at least through the photomask; and separating the photomask from the support whereby a first portion of the photopolymer layer below opaque areas of the mask remains on the photomask and a second portion of the photopolymer layer below opaque areas of the mask remains on the printing member, thereby forming a flexographic printing member comprising a relief pattern corresponding to the imagewise pattern. In some embodiments, the method may further comprise the step of exposing the second photopolymer portion to actinic radiation to cure any uncured regions thereof.

The photopolymer may be a liquid photopolymer and, in such cases, the method may further comprise, prior to the exposure step, applying the liquid photopolymer to the support while applying the photomask over the liquid photopolymer. In other embodiments, the photopolymer is a solid or semisolid having a cohesive strength lower than the adhesive strength to the photomask and to the support.

The photomask may be imaged in any suitable fashion, e.g., by thermal imaging or by ink-jet printing.

The support may be a polyester, PVC, polycarbonate, polypropylene or polystyrene film, or an aluminum or steel sheet. The support may have a thickness ranging from 100 to 500 µm. In some embodiments, the support further comprises an adhesion coating layer, an antistatic treatment layer and/or an anti-blocking layer.

In some embodiments, the method further comprises the step of applying a sheet to the second photopolymer portion and removing the sheet to remove at least some uncured material from the second photopolymer portion. The sheet may be made of, e.g., PET, PVC, polypropylene, cellulosic, a textile or paper, and may have a thickness ranging from 10-150 µm. The step of applying and removing the sheet may be repeated. The photopolymer withdrawn by the sheet may be removed therefrom for reuse.

During the application step, the liquid photopolymer may have a fluidity greater than its fluidity during the separation step. For example, during the separation step, the liquid photopolymer may be a gel or partially crosslinked. This may be achieved, in certain embodiments, by carrying out the application step at a first temperature and performing the separation step at a second temperature lower than the first temperature. The photopolymer may, for example, be a liquid at the first temperature and thixotropic or gel-like at the second temperature. In various embodiments, the first temperature ranges from 30-70° C. and the second temperature is below 30° C.

The step of exposing the second photopolymer portion to actinic radiation to cure any uncured regions thereof may occur in a liquid to eliminate oxygen inhibition.

It should be stressed that, as used herein, the term flexographic "plate" or "member" refers to any type of printing member or surface capable of recording an image using a relief pattern. The term "substantially" means ±10% (e.g., by weight or by volume), and in some embodiments, ±5%. The term "consists essentially of" means excluding other materials that contribute to function or structure. Percentages refer to weight percentages unless otherwise indicated.

DESCRIPTION OF DRAWINGS

The foregoing discussion will be understood more readily from the following detailed description of the disclosed technology, when taken in conjunction with the single figure of the drawing, which is an enlarged cross-sectional view of a positive-working printing member according to the invention.

DETAILED DESCRIPTION

Figure 1:
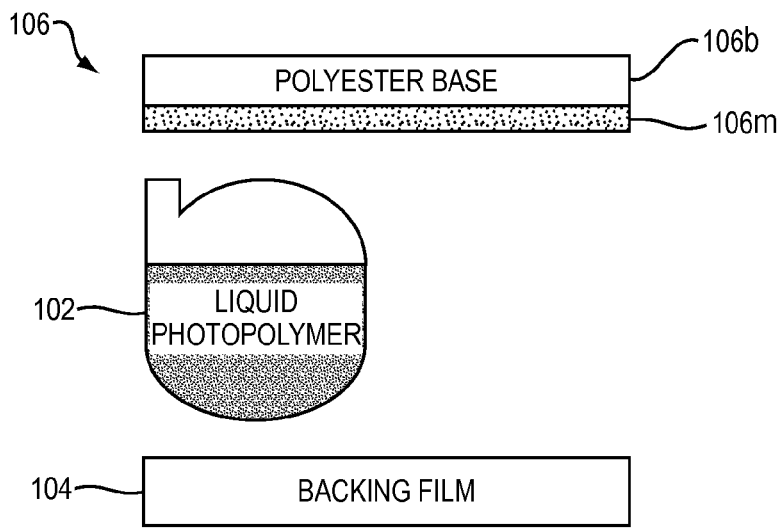
FIG. 1 schematically illustrates the components employed in a first embodiment of the invention utilizing a liquid photopolymer.

Refer first to FIG. 1, which illustrates the components used in practicing an embodiment of the invention involving a liquid photopolymer. The components include a source 102 of the liquid photopolymer, a backing film 104, and a photomask 106. Backing film 104 is typically a polyester film, but other types of polymers, such as polyvinyl chloride (PVC), polycarbonate, polypropylene, and/or polystyrene can be used to advantage, as can aluminum or steel supports. The thickness of the film 106m may be from 100 to 500 µm. Furthermore, backing film 104 may include an adhesion coating layer or/and an antistatic treatment layer or/and an anti-blocking layer as is well-known in the art.

The liquid photopolymer is a conventional liquid composition containing curable (by exposure to actinic radiation, e.g., UV radiation) oligomers, monomers, and photoinitiators. The composition may also contain one or more surfactants, plasticizers, solvents, and/or uncured rubber polymers. The viscosity of the photopolymer can be in the range of 50 cps to 100,000 cps, and preferably ranges from 500-30,000 cps. Exposure of the photopolymer to UV irradiation forms a tough rubber-like layer suitable for printing on a standard flexographic press. In various embodiments, the photopolymer composition is in a liquid state at an elevated temperature (e.g., 30-70° C.), and is in a thixotropic or gel-like state at a lower temperature (e.g., below 30° C.).

Figure 2A:
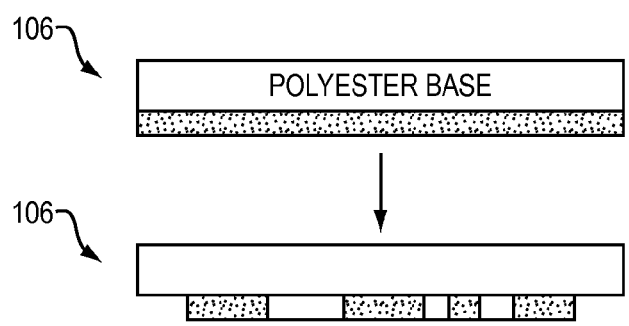
FIGS. 2A-2F schematically illustrate formation of a flexographic printing plate using a liquid photopolymer.

Photomask 106 comprises a transparent base layer 106b, which is typically a polyester film, and a mask layer 106m that is opaque to actinic radiation. (The ensuing discussion will focus, for exemplary purposes, on UV radiation, but it should be understood that any suitable type of actinic radiation can be utilized.) In one embodiment, mask layer 106m is IR-sensitive and may be imaged digitally, using a laser, whereby the IR-sensitive material is imagewise removed from the base layer 106b. See, e.g., U.S. Pat. Nos. 5,354,633 and 5,786,129. This procedure is illustrated in FIG. 2A. Another suitable type of photomask 106 is a transparent film with an inkjet-receptive transparent coating. In this case the opaque layer is imagewise deposited (i.e., printed) by an inkjet source onto the film to obtain the image.

Figure 2B:
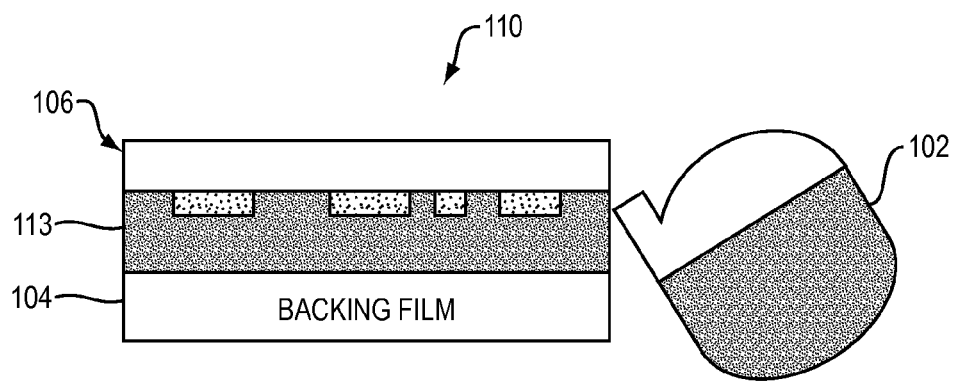
Figure 2C:
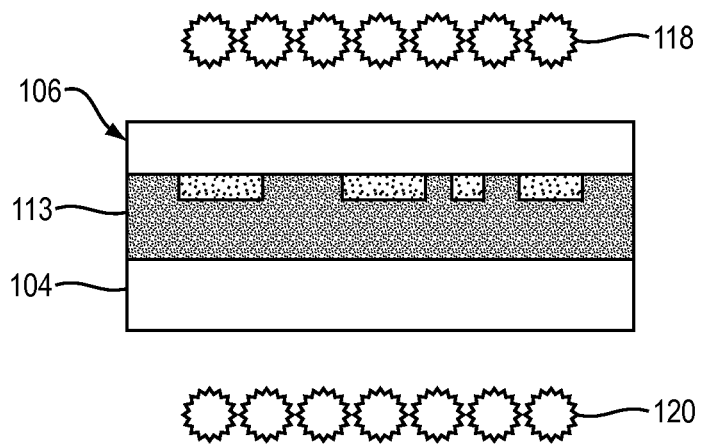
Figure 2D:
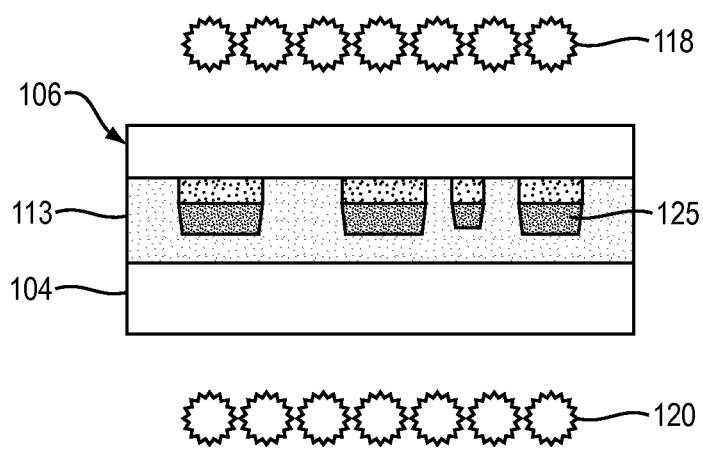

FIGS. 2A-2F illustrate a representative process sequence for forming a flexographic printing plate using a liquid photopolymer. As noted above, FIG. 2A illustrates imaging of the photomask 106. The liquid photopolymer is then cast between the imaged photomask 106 and the backing film 104, thereby producing a laminate structure 110 including a sandwiched photopolymer layer 113. Casting is generally accomplished by wet lamination of backing film 104 to mask 106, during which liquid photopolymer is supplied from the source 102. The resulting laminate 110 is then subjected to photoexposure through mask 106 and through backing film 104 by opposed UV sources 118, 120, respectively, as shown in FIG. 2C. Sources 118, 120 may be simple blacklight fluorescent lamps (e.g., with a $\lambda_{max}$ of 350 nm). FIG. 2D illustrates the result of the exposure: the photopolymer layer 113 is solidified except within regions 125 opposite opaque regions of photomask 106. These regions 125 remain liquid but do not extend fully through the photopolymer layer 113 to backing film 104 due to exposure of the photopolymer by source 120. Accordingly, the time and intensity of exposure from source 120 is adjusted so that a desired thickness of cured photopolymer is formed above backing film 104, thereby defining the depth of the uncured liquid regions 125.

Figure 2E:
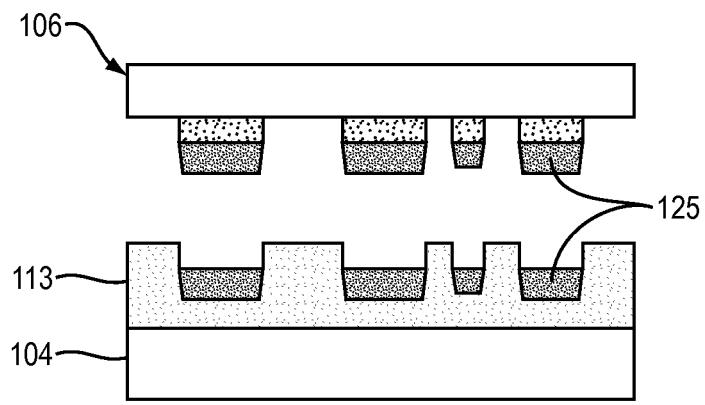
Figure 2F:
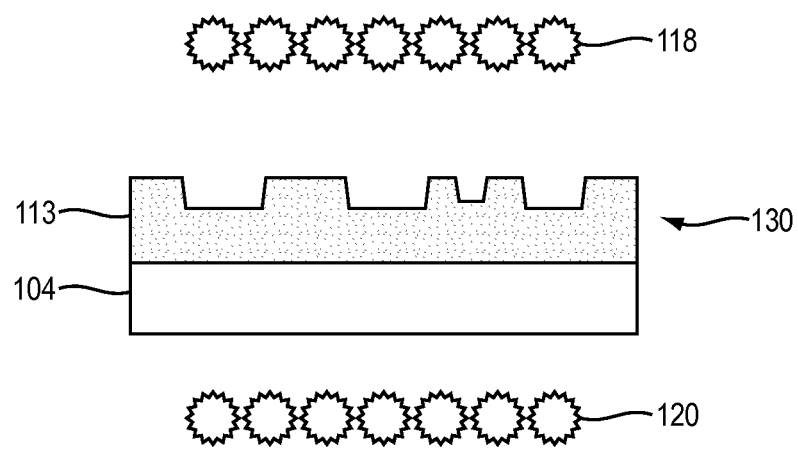
Figure 3A:
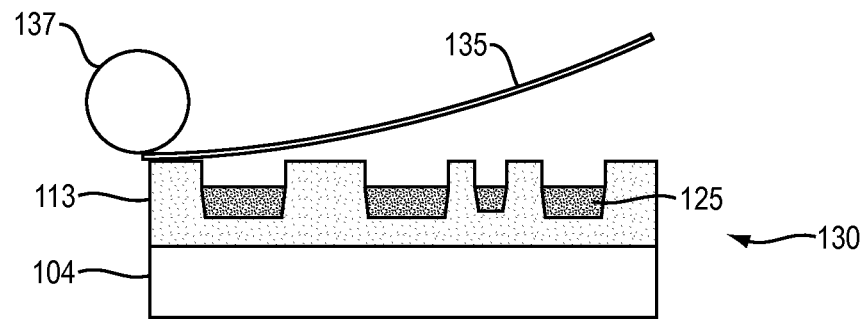
FIGS. 3A-3C schematically illustrate collection of uncured photopolymer following the steps illustrated in FIGS. 2A-2F.
Figure 3B:
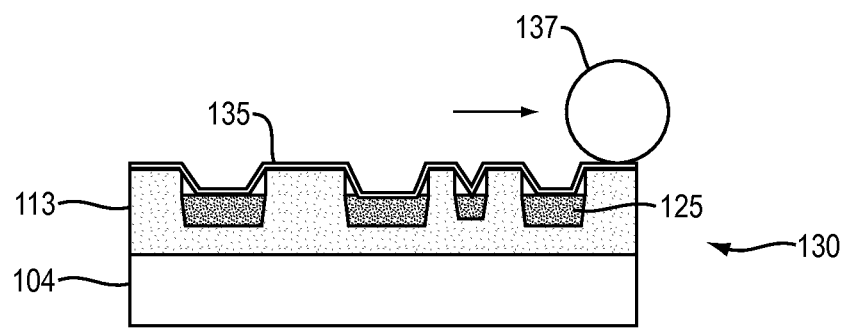
Figure 3C:
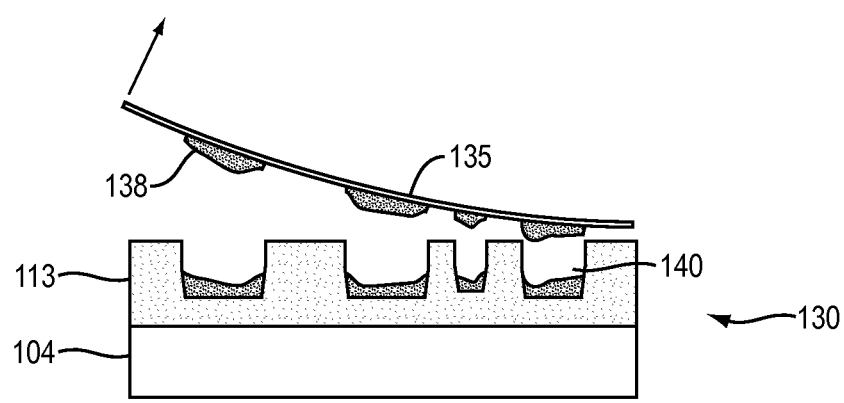

Mask 106 and backing film 104 are then separated as shown in FIG. 2E. The cured portion of photopolymer layer 113 remains adhered to backing film 104 and releases from photomask 106. A portion of the liquid photopolymer in regions 125 remains on the photomask and a portion remains on the cured photopolymer layer 113; often about half of the liquid remains with each of the separated layers. Uncured photopolymer can be collected from the photomask 106 in a conventional manner (e.g., using a doctor blade) and reused. Further post-cure radiation exposure, as shown in FIG. 2F, solidifies liquid photopolymer remaining on cured photopolymer layer 113, resulting in a ready-to-use flexographic printing plate 130. Alternatively, uncured photopolymer remaining on plate 130 can be collected (e.g., for re-use) rather than cured. This may be accomplished using an air stream or, as shown in FIGS. 3A-3C, by means of a dry, smooth film 135. With reference to FIG. 3A, the removal film 135 is firmly applied to the surface of plate 130 by, for example, a rubber roller 137. The roller 137 presses film 135 into the recessions containing uncured photopolymer 125 as shown in FIG. 3B, so that when film 135 is gently delaminated from plate 130, it takes with it portions 137 of the uncured photopolymer remaining in the recessions, while portions 140 will remain within the recessions. The removal, in other words, is typically not complete after a single iteration, but the illustrated procedure may be repeated—e.g., 2-10 times, or more preferably 3-6 times, thereby removing of most of the uncured photopolymer. In this way the need for washing the plate is avoided. It is preferable to use a new piece of film 135 for each iteration of application and separation; uncured photopolymer can be collected from the film 135 by a doctor blade or other suitable means, and reused. The film 135 can be polyethylene teraphthalate (PET), PVC, polypropylene, cellulosic, coated or uncoated paper, or other suitable material. Typical film thickness range from 10-150 μm, preferably from 20-50 μm.

In some embodiments, the liquid photopolymer is fully flowable in a liquid state during the casting step illustrated in FIG. 2B, but during the separation step (shown in FIG. 2E) is in a gel or partially crosslinked form, i.e., it does not flow freely, if at all. The term "limited fluidity" herein refers to a material in gel form, a thixotropic material or a fluid with viscosity above 200,000 cps. As noted above, this behavior may be temperature-dependent, so that the liquid photopolymer is applied at a high temperature (e.g., 30-70° C.) but separation occurs at a lower temperature (e.g., below 30° C.).

Figure 4:
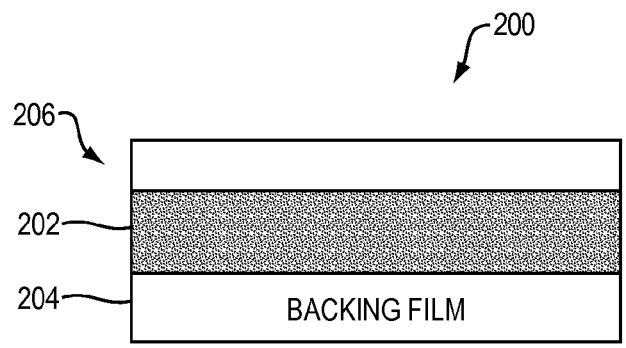
FIG. 4 is an enlarged sectional view of a laminate structure, having a solid or semisolid photopolymer layer, prior to imaging.

In still other embodiments, as representatively shown in FIG. 4, a laminate structure 200 has a solid or semisolid photopolymer layer 202, a backing film 204 along one surface of photopolymer layer 202 and a protective film 206 over the opposite surface of photopolymer layer 202. By "semisolid" is herein meant a cream a or gel-like material that can support its own weight and hold its form (e.g., at room temperature). Backing film 204 may be identical to the film 104 described above. Protective layer 206 keeps the photopolymer layer 202 clean and free of scratches or other damage. The protective layer 206 may be polyester, polypropylene, PVC or other suitable polymeric film having a thickness ranging from, for example, 20-200 μm, and may be coated for improved release properties.

Although solid, photopolymer layer 202 can be cured by exposure to actinic radiation. In its uncured state, this layer has a relatively low internal cohesive strength (i.e., the propensity of the molecules in layer 202 to remain connected and not tear apart)—in particular, its internal cohesive strength is lower than its adhesive strength to backing film 204 and to the photomask applied during processing as described below. When cured, however, the internal cohesion of photopolymer 202 and its adhesive strength to backing film 204 are higher than its adhesive strength to the photomask. The photopolymer layer may comprise UV-curable monomers such as 1,6-hexanediol diacrylate or methacrylate, isodecyl acrylate, lauryl acrylate, isobornyl acrylate and/or oligomers such as polyester urethane acrylate, polyether urethane acrylate, polybuthadiene diacrylates, butadiene- or isoprene-based polymer or copolymer, and/or fillers of micron and submicron sizes such as silica, alumina and carbon black, and/or photoinitiators such benzildimethylketal, 2,4,6-trimethyl-benzoyl-diphenyl-phosphineoxide, and/or additives such as surfactants and/or thixotropic agents.

Figure 5A:
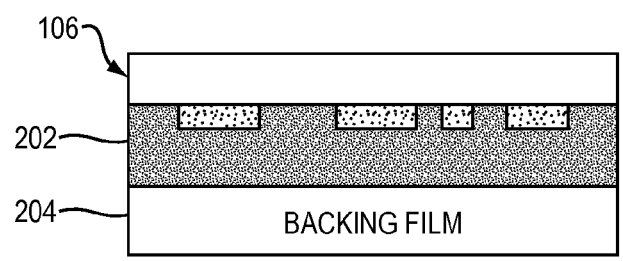
FIGS. 5A-5E schematically illustrate formation of a flexographic printing plate using the laminate structure shown in FIG. 4.
Figure 5B:
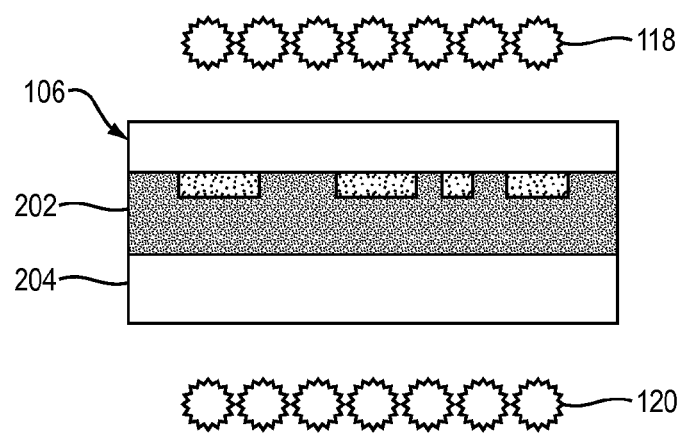
Figure 5C:
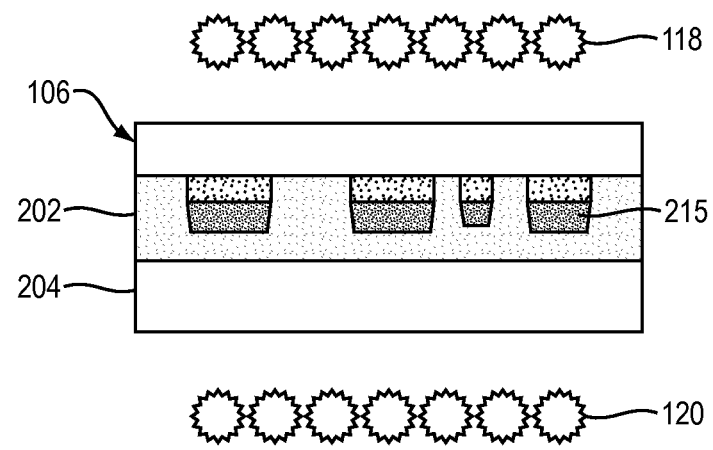

Processing of this embodiment is illustrated in FIGS. 5A-5E. The protective layer 206 is removed and an imaged photomask 106 (as described above) is applied (e.g., laminated) to the top surface of photopolymer layer 202, as shown in FIG. 5A. The laminate structure is exposed to actinic radiation through the photomask 106 (by radiation source 118) and also through backing film 204 (by radiation source 120) (FIG. 5B). FIG. 5C illustrates the result of the exposure: photopolymer layer 202 is cured except within regions 215 opposite opaque regions of photomask 106. In this case, the regions 215 are not liquid but have low cohesion.

Figure 5D:
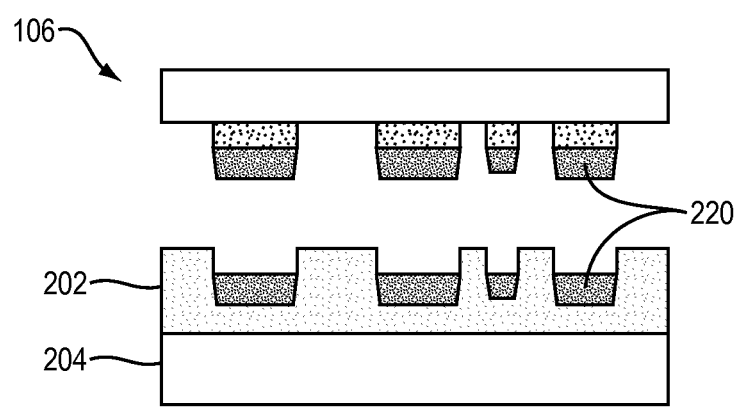
Figure 5E:
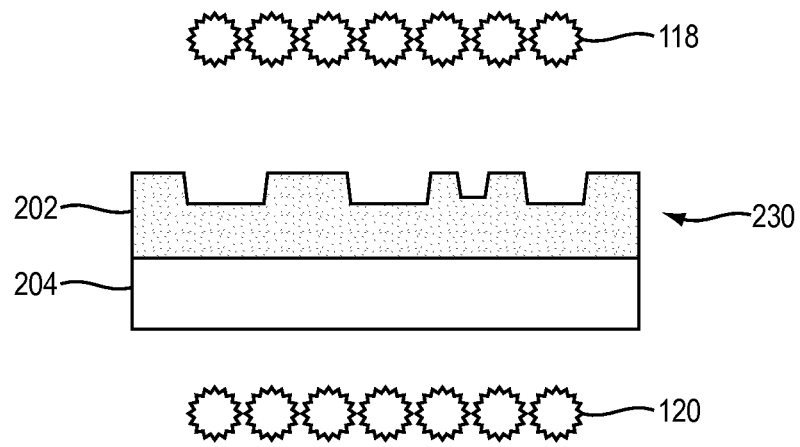

Mask 106 and backing layer 204 are then separated as shown in FIG. 5D. The cured photopolymer layer 202 remains adhered to backing film 104 but releases from photomask 106. A portion of the uncured photopolymer in regions 220 remains on the photomask and a portion remains on the cured photopolymer layer 202. Uncured photopolymer can be collected from the photomask 106 in a conventional manner and reused. Further post-cure radiation exposure, as shown in FIG. 5E, solidifies liquid photopolymer remaining on cured photopolymer layer 202, resulting in a ready-to-use flexographic printing plate 230.

Figure 6:
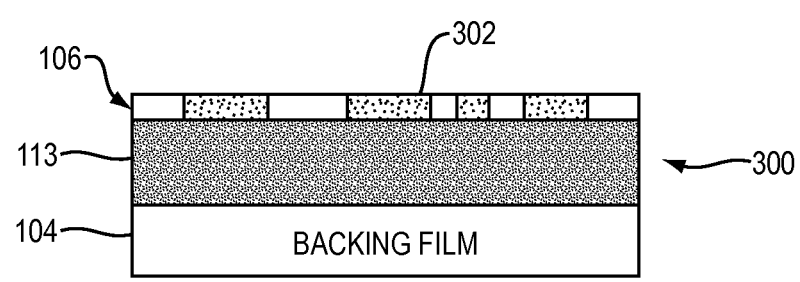
FIG. 6 is an enlarged sectional view of a laminate structure, having a solid or semisolid photopolymer layer and an imaged photomask, prior to imaging.

In a variation 300 of this embodiment, illustrated in FIG. 6, the mask film 106 is used as the topmost layer rather than a protective film. In this case flexographic printing member 300 has an integrated structure comprising or consisting of the backing layer 204, the solid or semisolid photopolymer layer 202 and the mask layer 106. The photomask 106 may be imaged by a thermal or inkjet device to obtain an imagewise pattern of opaque regions 302. The plate 300 may be UV-exposed and processed as shown in FIGS. 5B-5E.

EXAMPLE 1

A liquid photopolymer composition was prepared using the materials set forth in the following table by mixing the components at 50° C.

| Weight % | Ingredients of Liquid Photopolymer |
|---|---|
| 57 | Polyesther urethane acrylate oligomer, sold under the trade name BR-7432GB by Dymax, Torrington, CT (USA) |
| 28 | Isobornyl acrylate, sold under the trade name EBECRYL IBOA by Cytec Surface Specialties, Drogenbos, Belgium |
| 14 | Ethoxylated nonylphenol acrylate, sold under the trade name PHOTOMER 4003 by Cognis Corporation, Cincinnati, OH (USA) |
| 1 | Mixture of methanone, (diphenylphosphinyl)(2,4,6-trimethyl-phenyl) and 1-propanone, 2-hydroxy-2-methyl-1-phenyl-, sold under the trade name DURACURE 4265 by BASF, Missauga, Canada |

Clear polyester film sold under the trade name SKYROL SH-92 by SMP Corporation, Covington, Ga. (USA), was used as backing support film. The film thickness was 175 μm. A digitally imaged photomask produced by Barak Polymers, Rishon Le-Zion, Israel was used as the polyester mask film.

Two plates were prepared as follows. A sheet of the backing film and the mask were wet laminated, with the liquid photopolymer composition being introduced between the layers as they were brought into contact, keeping the thickness of the liquid photopolymer to 1 mm by using 1 mm blocks between the backing and the mask films near the both sides of the sheets. The laminate was gently placed under OSRAM EVERSUN black light fluorescent lamps and exposed for 30 sec through the backing film and 60 sec through the mask film. The irradiation intensity was 5 mW/cm².

The mask layer of each plate was then gently separated from the backing film. The mask removed part of uncured photopolymer, leaving the plate with a relief pattern and residual uncured photopolymer within the cavities thereof. The first-st plate was gently placed into a water bath and post-cured under the same black light for 10 min. Water prevents oxygen inhibition and confers a tack-free surface on the cured photopolymer. Then the plate was installed on a flexographic press (the MAF-6 from Machine Flessograficke, Germany). Screens with resolution of 150 lpi were printed with good quality.

The second plate was laminated with 30 μm polyester film (SKYROL SH71S from SMP Corporation), and this film was firmly applied onto the plate surface with a rubber roller. Then the film was gently delaminated from the plate, taking with it portion of the uncured photopolymer. This lamination-delamination process was repeated four times with fresh lengths of film. The plate was then installed on the MAF-6 press and was observed to print with a resolution of 150 lpi with good quality.

EXAMPLE 2

A semi-solid photopolymer composition is prepared using the materials set forth in the following table by mixing the components at 80° C.

| Weight % | Ingredients of Semi-solid Photopolymer |
|---|---|
| 98 | Polyether urethane acrylate oligomer, sold under the trade name BR-543 by Dymax, Torrington, CT (USA ) |
| 2 | Mixture of methanone, (diphenylphosphinyl)(2,4,6-trimethyl-phenyl) and 1-propanone, 2-hydroxy-2-methyl-1-phenyl-, sold under the trade name DURACURE 4265 by BASF, Missauga, Canada |

Polyether urethane acrylate oligomer at room temperature has a semi-solid paste-like consistency due to crystallization. 175 μm clear polyester film sold under the trade name SKYROL SH-92 by SMP Corporation, Covington, Ga. (USA), is used as backing support film. A digitally imaged photomask produced by Barak Polymers, Rishon Le-Zion, Israel is used as the polyester mask film.

The plate is prepared as follows. A sheet of the backing film and the mask is wet laminated at 60° C., with the melted photopolymer composition being introduced between the layers as they are brought into contact, keeping the thickness of the melted photopolymer to 1 mm by using 1 mm blocks between the backing and the mask films near the both sides of the sheets. The laminate is gently placed under OSRAM EVERSUN black light fluorescent lamps and exposed for 30 sec through the backing film and 60 sec through the mask film. The irradiation intensity is 5 mW/cm².

The laminate is further cooled at 20° C. for 2 hours to allow uncured photopolymer getting semi-solid form. The mask layer is then gently separated from the backing film. The mask removes part of uncured photopolymer, leaving the plate with a relief pattern and residual uncured photopolymer within the cavities thereof. The plate is gently placed into a water bath and post-cured under the same black light for 10 min. The plate is then ready for printing.

Although the present invention has been described with reference to specific details, it is not intended that such details should be regarded as limitations upon the scope of the invention, except as and to the extent that they are included in the accompanying claims.

What is claimed is:

1. A method of producing a flexographic printing member, the method comprising the steps of:
    providing a precursor comprising (i) an imaged photomask having an imagewise pattern of opaque and non-opaque regions, the opaque regions substantially blocking passage therethrough of actinic radiation, (ii) a support, and (iii) disposed between the photomask and the support and in contact with opposed surfaces thereof, a layer of a photopolymer polymerizable by actinic radiation;
    exposing the precursor to actinic radiation at least through the photomask;
    separating the photomask from the support whereby (i) a first portion of the photopolymer layer only below opaque areas of the photomask remains on the photomask and a second portion of the photopolymer layer only below opaque areas of the photomask remains on the printing member and (ii) substantially none of the photopolymer remains on the photomask below non-opaque areas, thereby forming a flexographic printing member comprising a photopolymer relief pattern on the support corresponding to the imagewise pattern; and applying a sheet to the second photopolymer portion and removing the sheet to remove at least some uncured material from the second photopolymer portion.

2. The method of claim 1, further comprising the step of exposing the second portion of the photopolymer layer to actinic radiation to cure any uncured regions thereof.

3. The method of claim 1, wherein the photopolymer is a liquid photopolymer and further comprising, prior to the exposure step, applying the liquid photopolymer to the support while applying the photomask over the liquid photopolymer.

4. The method of claim 1, wherein the photopolymer is a solid or semisolid having a cohesive strength lower than an adhesive strength to the photomask and to the support.

5. The method of claim 1, wherein the imaged photomask is imaged by thermal imaging.

6. The method of claim 1, wherein the imaged photomask is imaged by ink-jet printing.

7. The method of claim 1, wherein the support is polyester, PVC, polycarbonate, polypropylene, polystyrene, aluminum or steel.

8. The method of claim 7, wherein the support has a thickness ranging from 100 to 500 μm.

9. The method of claim 1, wherein the support further comprises at least one of an adhesion coating layer, an anti-static treatment layer or an anti-blocking layer.

10. The method of claim 1, further comprising repeating the sheet application and removal step at least once.

11. The method of claim 1, wherein the sheet is made of PET, PVC, polypropylene, cellulosic, a textile or paper.

12. The method of claim 1, wherein the sheet has a thickness ranging from 10-150 μm.

13. The method of claim 1, further comprising the step of removing photopolymer from the sheet for reuse.

14. A method of producing a flexographic printing member, the method comprising the steps of:
providing a precursor comprising (i) an imaged photomask having an imagewise pattern of opaque and non-opaque regions, the opaque regions substantially blocking passage therethrough of actinic radiation, (ii) a support, and (iii) disposed between the photomask and the support and in contact with opposed surfaces thereof, a layer of a photopolymer polymerizable by actinic radiation;
exposing the precursor to actinic radiation at least through the photomask; and
separating the photomask from the support whereby (i) a first portion of the photopolymer layer only below opaque areas of the photomask remains on the photomask and a second portion of the photopolymer layer only below opaque areas of the photomask remains on the printing member and (ii) substantially none of the photopolymer remains on the photomask below non-opaque areas, thereby forming a flexographic printing member comprising a photopolymer relief pattern on the support corresponding to the imagewise pattern;
wherein the photopolymer is a liquid photopolymer and further comprising, prior to the exposure step, applying the liquid photopolymer to the support while applying the photomask over the liquid photopolymer, and further wherein during the application step the liquid photopolymer has a fluidity greater than a fluidity during the separation step.

15. The method of claim 14 wherein, during the separation step, the liquid photopolymer is a gel.

16. A method of producing a flexographic printing member, the method comprising the steps of:
providing a precursor comprising (i) an imaged photomask having an imagewise pattern of opaque and non-opaque regions, the opaque regions substantially blocking passage therethrough of actinic radiation, (ii) a support, and (iii) disposed between the photomask and the support and in contact with opposed surfaces thereof, a layer of a photopolymer polymerizable by actinic radiation;
exposing the precursor to actinic radiation at least through the photomask; and
separating the photomask from the support whereby (i) a first portion of the photopolymer layer only below opaque areas of the photomask remains on the photomask and a second portion of the photopolymer layer only below opaque areas of the photomask remains on the printing member and (ii) substantially none of the photopolymer remains on the photomask below non-opaque areas, thereby forming a flexographic printing member comprising a photopolymer relief pattern on the support corresponding to the imagewise pattern;
wherein the photopolymer is a liquid photopolymer and further comprising, prior to the exposure step, applying the liquid photopolymer to the support while applying the photomask over the liquid photopolymer, and further wherein the application step occurs at a first temperature and the separation step occurs at a second temperature lower than the first temperature.

17. The method of claim 16, wherein the photopolymer is liquid at the first temperature and thixotropic at the second temperature.

18. The method of claim 16, wherein the first temperature ranges from 30-70° C. and the second temperature is below 30° C.

19. The method of claim 2, wherein the step of exposing the second photopolymer portion to actinic radiation to cure any uncured regions thereof occurs in a liquid to eliminate oxygen inhibition.

20. A method of producing a flexographic printing member, the method comprising the steps of:
providing a precursor comprising (i) an imaged photomask having an imagewise pattern of opaque and non-opaque regions, the opaque regions substantially blocking passage therethrough of actinic radiation, (ii) a support, and (iii) disposed between the photomask and the support and in contact with opposed surfaces thereof, a layer of a photopolymer polymerizable by actinic radiation;
exposing the precursor to actinic radiation at least through the photomask; and
separating the photomask from the support whereby (i) a first portion of the photopolymer layer only below opaque areas of the photomask remains on the photomask and a second portion of the photopolymer layer only below opaque areas of the photomask remains on the printing member and (ii) substantially none of the photopolymer remains on the photomask below non-opaque areas, thereby forming a flexographic printing member comprising a photopolymer relief pattern on the support corresponding to the imagewise pattern,
wherein the flexographic printing member is not subjected to a washing step.

\* \* \* \* \*